United States Patent [19]
Lee

[11] Patent Number: 5,790,041
[45] Date of Patent: Aug. 4, 1998

[54] APPARATUS AND METHOD TO DISPLAY NETWORK CONNECTION STATUS ON A JACK PANEL

[75] Inventor: Sherman Lee, Rancho Palos Verdes, Calif.

[73] Assignee: Advanced Micro Devices, Inc., Sunnyvale, Calif.

[21] Appl. No.: 388,646

[22] Filed: Feb. 14, 1995

[51] Int. Cl.$^6$ .................. G08B 5/22; H01R 3/00
[52] U.S. Cl. .................. 340/815.45; 340/815.42; 340/815.47; 439/490; 439/910; 362/26; 362/31
[58] Field of Search .................. 340/815.45, 815.42, 340/815.47; 439/55, 56, 59, 488–491, 910; 361/736, 737, 748, 752, 796; 362/26, 29, 30, 31, 800

[56] References Cited

U.S. PATENT DOCUMENTS

| | | | |
|---|---|---|---|
| 4,504,830 | 3/1985 | Boehme | 340/815.31 |
| 4,575,680 | 3/1986 | Gold | 324/433 |
| 4,978,317 | 12/1990 | Pocrass | 439/490 |
| 5,068,652 | 11/1991 | Kobayashi | 340/815.03 |
| 5,268,823 | 12/1993 | Yergenson | 340/815.31 |
| 5,387,901 | 2/1995 | Hardt | 340/815.42 |
| 5,487,666 | 1/1996 | DiGiovanni | 439/491 |
| 5,537,292 | 7/1996 | Bowen | 361/737 |
| 5,613,873 | 3/1997 | Bell, Jr. | 439/490 |

*Primary Examiner*—Donnie L. Crosland
*Attorney, Agent, or Firm*—Skjerven, Morrill, MacPherson, Franklin & Friel LLP; Edward C. Kwok; Omkar K. Suryadevara

[57] ABSTRACT

A jack has a side opening that allows light from a light emitter that is mounted adjacent to the side opening to enter the jack's cavity and emerge from the jack's front opening that is used for insertion of a plug. In one embodiment, when a plug is inserted into the jack, a transparent portion of the plug allows the light to emerge from a posterior end of the plug to provide a visible indication of the state of the connection between the jack and the plug. Emergence of light from the jack's front opening results in saving space on a jack panel because panel space conventionally used for a LED is no longer needed. The side opening is located adjacent to the jack's bottom surface that is adjacent to a printed circuit board (PCB) on which the jack is mounted. In one embodiment, the light emitter is mounted on the PCB near the side opening between the jack's bottom surface and the PCB's top surface. Using the PCB space underneath the jack's bottom surface frees up PCB space that is conventionally used for supporting LEDs.

42 Claims, 7 Drawing Sheets

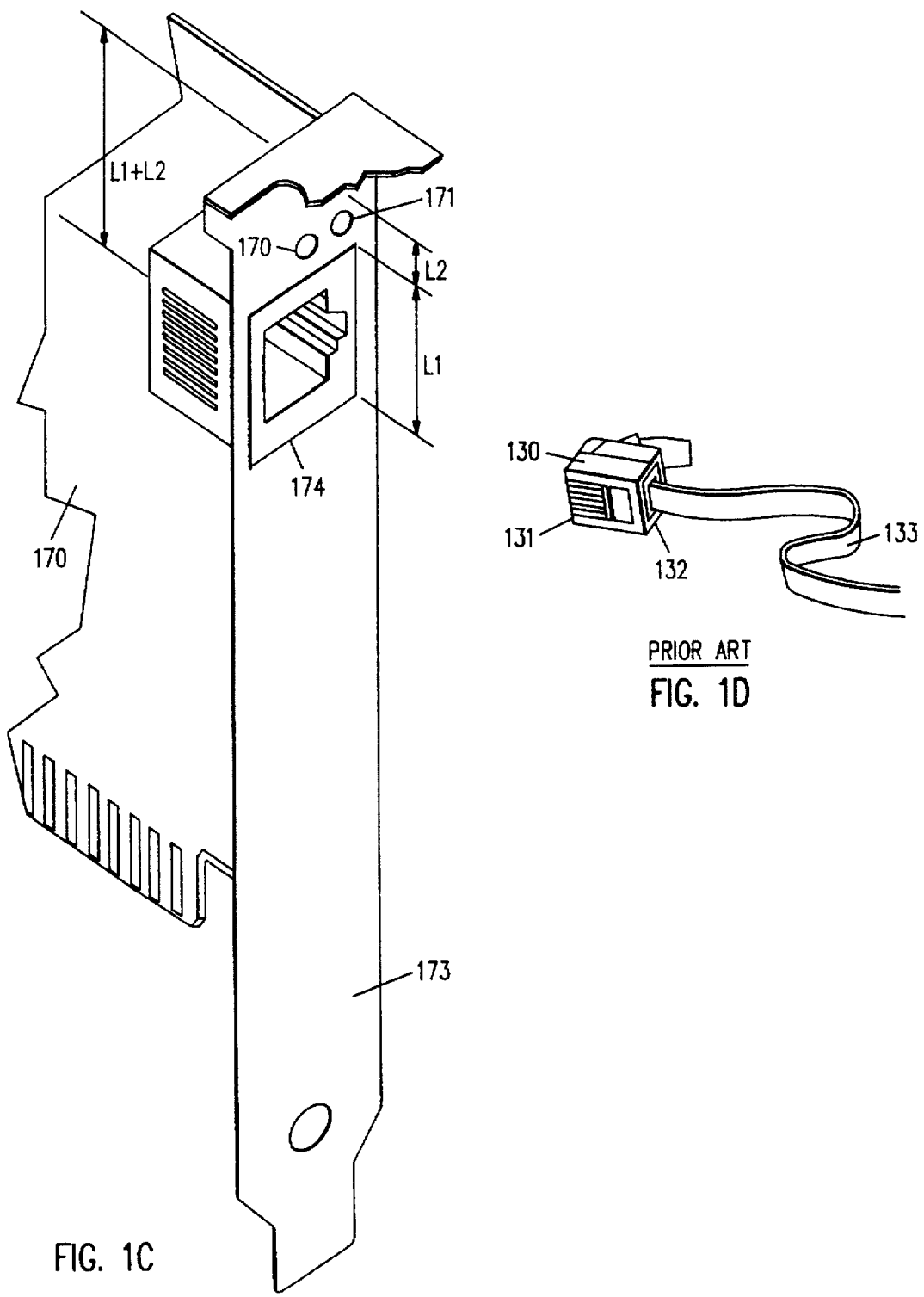

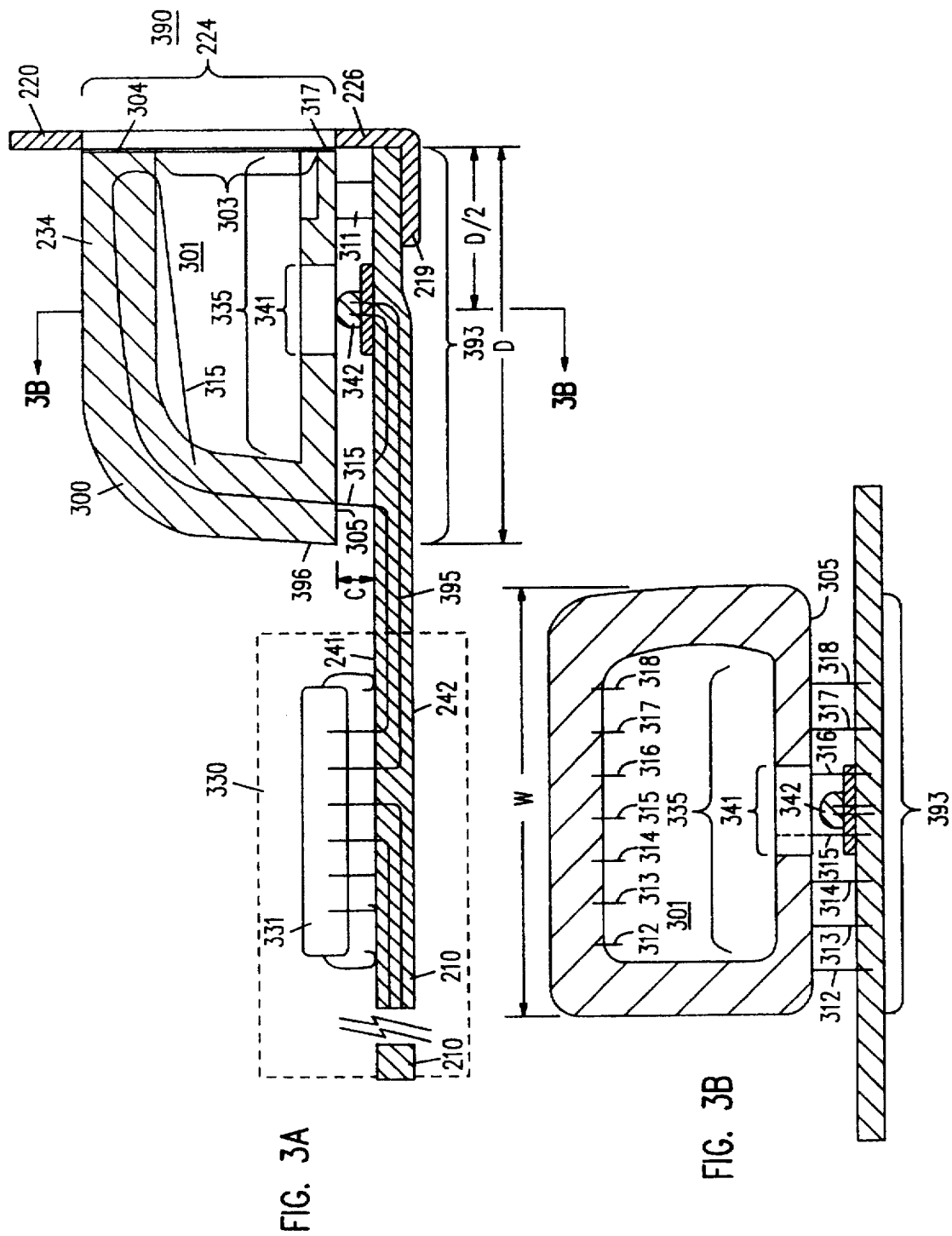

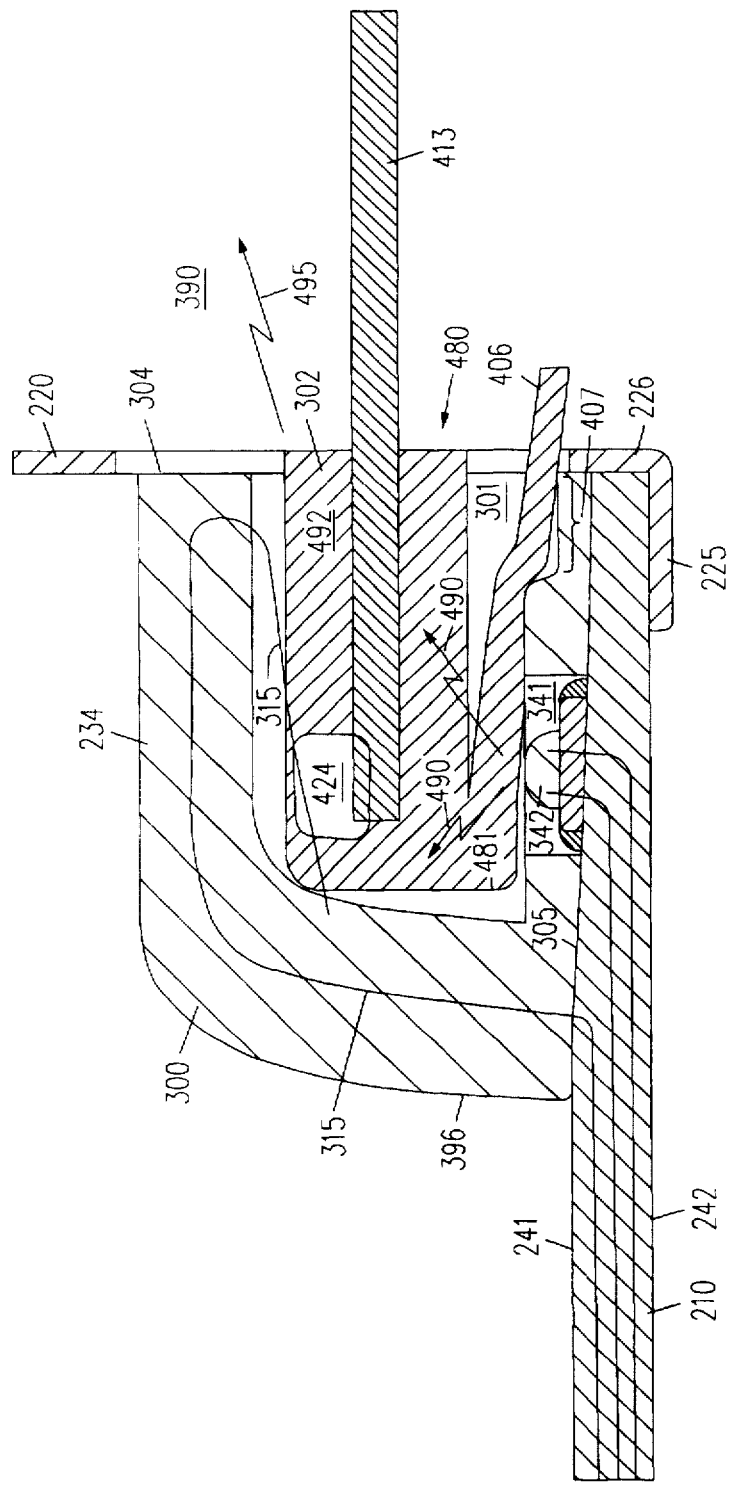

APPARATUS AND METHOD TO DISPLAY NETWORK CONNECTION STATUS ON A JACK PANEL

FIELD OF THE INVENTION

The present invention relates generally to an apparatus and method to display status on a jack panel. More particularly the present invention relates to the use of a front opening of a jack to provide visible indication of the state of a light emitting diode associated with the jack.

BACKGROUND OF THE INVENTION

In a conventional electrical apparatus 100 (FIG. 1A), such as a network interface card (NIC) of a personal computer (PC), a jack panel 110 can include a number of jacks 111–115 for various communication links and a number of light emitting diodes (LEDs) 121–125 associated respectively with jacks 111–115 for indicating status of the communication links. Jacks 111–115 are suitable for use with a RJ45 plug, such as plug 130 (FIG. 1D) that has an anterior end 131 suitable for insertion into a jack and a posterior end 132 at which is connected a cable 133.

Although LEDs 121–125 are mounted adjacent to corresponding jacks 111–115, such LEDs take up space (sometimes referred to as "panel space") on jack panel 110 due to size of a LED and due to separation distance "s" (FIG. 1A), for example of 0.2 centimeter, between a LED, such as LED 121 and a jack, such as jack 111.

In another conventional jack panel 140 (FIG. 1B), LEDs 141–144 are mounted in a separate area A that is located away from corresponding jacks 151–154. A number of legends, such as legends 161–164 that are engraved in panel 140 adjacent to LEDs 141–144 establish correspondence between LEDs 141–144 and jacks 151–154. Legends 161–164 can be, for example "COMM", "FAX", "MODEM" and "PRINTER". Jack panel 140 also has a space disadvantage because LEDs 141–144 and legends 161–164 take up panel space in area A.

In addition to taking up panel space on a jack panel, mounting a LED separately from a jack takes up additional space (sometimes referred to as "PCB space") on a printed circuit board (PCB). In FIG. 1C, LEDs 170 and 171 (FIG. 1C) take up panel space L2 on jack panel 173 that is in addition to panel space L1 taken up by jack 174. Therefore, PCB space L2 is also needed on printed circuit board 180 to support LEDs 170 and 171 that are associated with jack 174.

SUMMARY OF THE INVENTION

In accordance with this invention, a jack has a side opening that allows light from a light emitter that is mounted adjacent to the side opening to enter the jack's cavity and emerge from the jack's front opening that is used for insertion of a plug.

In one embodiment, when a plug is inserted through the front opening into the jack's cavity, a transparent portion of the plug allows at least a portion of the light from the side opening to emerge from a posterior end of the plug, to provide a visible indication of the state of for example the connection between the jack and the plug. This invention results in saving space on a jack panel because panel space conventionally used by a LED is no longer needed.

In one embodiment, the side opening is located in the jack's bottom surface that is adjacent and parallel to a printed circuit board (PCB) on which the jack is mounted. The light emitter is mounted on the PCB, in an area under the jack, near the side opening between the jack's bottom surface and the PCB's top surface. By using the PCB space under the jack's bottom surface, this invention frees up PCB space that is conventionally used for mounting LEDs.

In one embodiment, the jack is made of an opaque material so that light from the associated LED is not corrupted by light from another LED associated with a neighboring jack. Corruption of light between neighboring jacks is an important factor when two or more jacks are located in the same jack assembly.

BRIEF DESCRIPTION OF THE DRAWING

FIGS. 1A–1C illustrate various jack panels of the prior art.

FIG. 1D illustrates a prior art plug for use with one of the jacks in FIGS. 1A–1C.

FIGS. 3A and 3B illustrate cross-sectional views of the apparatus illustrated in FIG. 2 in the direction 3A—3A of FIG. 2 and 3B—3B of FIG. 3A respectively.

FIG. 4A illustrates transmission of light from a light emitter through a jack and a plug in one embodiment of this invention.

DETAILED DESCRIPTION

Figure 1A:
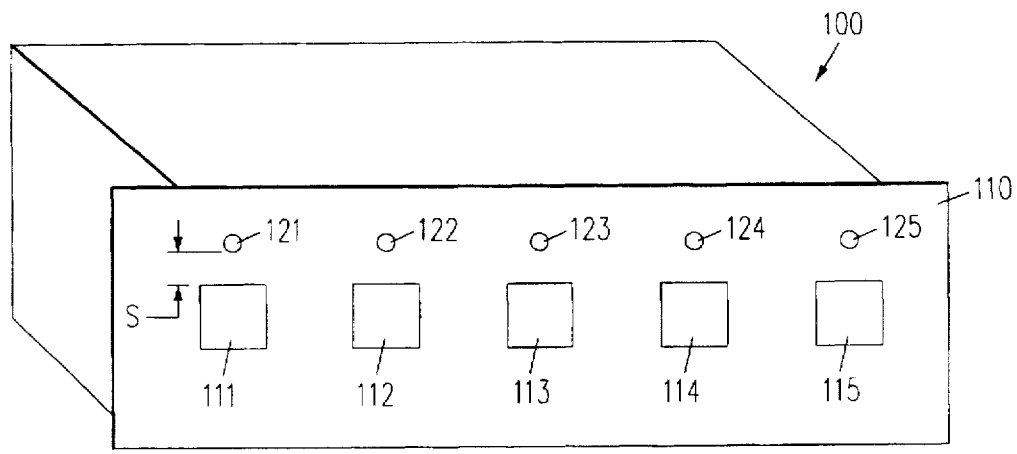
Figure 1B:
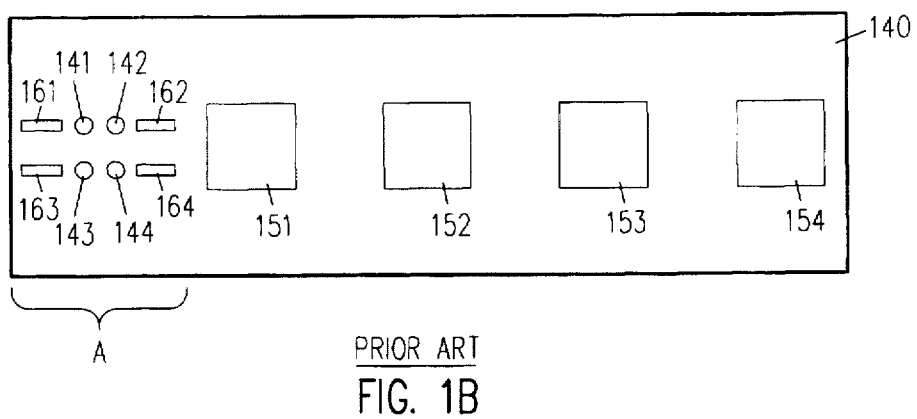
Figure 2:
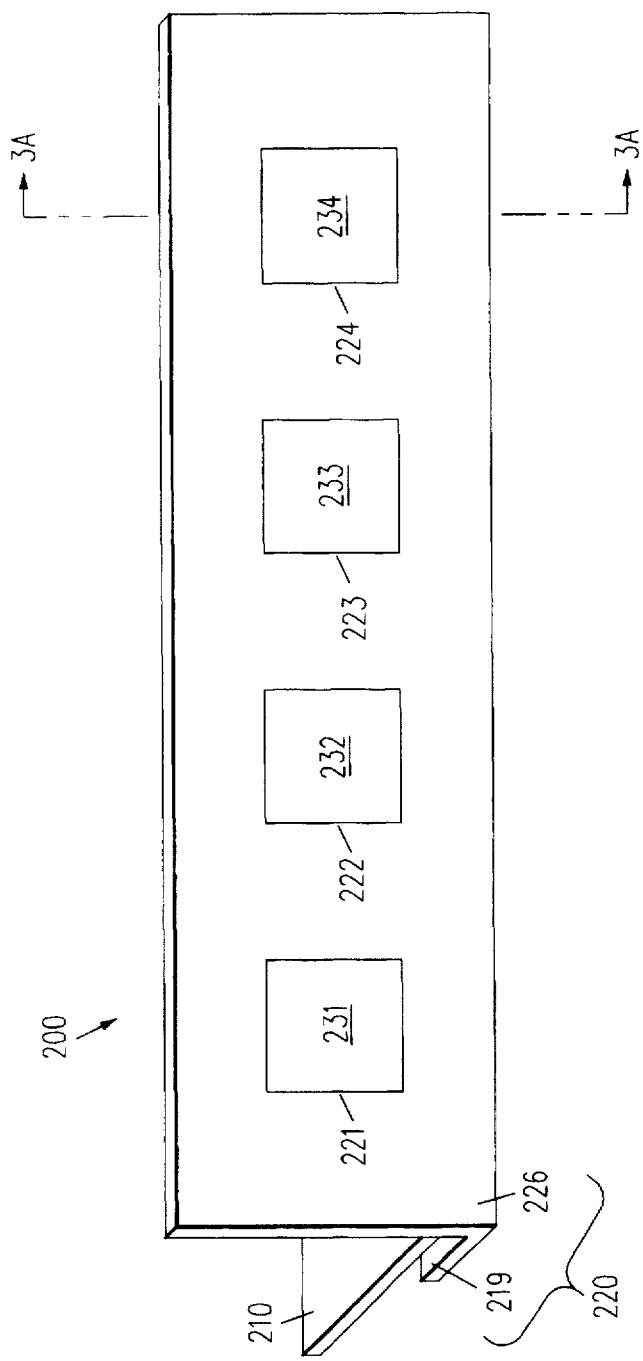
FIG. 2 illustrates an electrical apparatus including a number of jacks mounted in a jack panel in one embodiment of this invention.

FIG. 2 illustrates one embodiment of an electrical apparatus 200, such as a network interface card (NIC) for a personal computer (PC). Electrical apparatus 200 includes a printed circuit board 210 that is mounted on a bottom wall 219 of a jack panel 220. In one embodiment, printed circuit board 210 has an edge connector (not shown) for insertion into an expansion slot of a personal computer (not shown).

Jack panel 220 has a number of openings 221–224 formed in front wall 226 through which are accessible a number of jacks 231–234. Jacks 231–234 are mounted on top surface 241 (FIG. 3A) of printed circuit board 210. Printed circuit board 210 has a bottom surface 242 that is physically attached to a bottom wall 219 of jack panel 220.

Jack 234 (FIG. 3A) includes a housing 300 that encloses a cavity 301 for receipt of a plug 302 (FIG. 4) through a front opening 303 (FIG. 3A) in front surface 304 of housing 300. Housing 300 has a bottom surface 305 on which is formed at least one leg 311 that is mounted on top surface 241 of printed circuit board 210. Jack 234 also has a number of leads, such as leads 312–318 (FIG. 3B) that are connected to a circuit 330 of printed circuit board 210. Circuit 330 can be any circuit such as a circuit on a NIC card that can include, for example, an integrated circuit 331.

Housing 300 also has a portion (also referred to as "jack portion") 335 that defines side opening 341 opposite to which is mounted a light emitter such as light emitting diode LED 342. Side opening 341 allows transmission of light from LED 342 into cavity 301. In one embodiment, side opening 341 has a diameter of approximately the same size as the diameter of LED 342. However, in alternative embodiments, side opening 341 can be either larger or smaller than the diameter of LED 342.

A portion of the transmitted light passes through front opening 303 of jack 234 and through opening 224 of jack panel 220 to a front region 390 to provide a visible indication of the state of LED 342. In one embodiment, LED 342 is mounted on printed circuit board 210 in an area 393 underneath jack 234, between bottom surface 305 and top surface 241 that are parallel to each other. During assembly, LED 342 is mounted on printed circuit board 210 by, for example, surface mount technology and then jack 234 is mounted over LED 342 in area 393 surrounding LED 342.

A lead 395 of LED 342 is also connected to circuit 330 that associates LED 342 with jack 234, for example to indicate that a network connection through plug 302 and jack 234 is operative.

In one embodiment, the centers of side opening 341 and LED 342 are aligned with each other and are both located at a distance D/2 (FIG. 3A) from front surface 304, wherein distance D is the distance between front surface 304 and rear surface 396 of housing 300.

The location of side opening 341 and LED 342 with respect to jack panel 220 is not significant for practicing this invention, although the location of side opening 341 with respect to LED 342 should allow a portion (in one embodiment the majority) of light from LED 342 to pass through front opening 303 to front region 390 outside jack 234. For example, a LED and a jack having a vertical side opening can be mounted beside each other on a PCB to obtain panel space savings, although PCB space saving is forfeited by such mounting.

To use jack 234, a user inserts a plug 302 (FIG. 4A) into a cavity 301 of jack 234. In this embodiment, a clip 406 of plug 302 exerts a spring force on a recessed portion 407 of housing 300 underneath clip 406 to keep plug 302 in place in cavity 301. A user can remove plug 302 from jack 234 by pulling clip 406 toward cable 413 while pulling out plug 302. Clip 406 is not a critical component of this invention and plugs other than an RJ45 plug can be used in other embodiments.

When plug 302 is properly inserted into cavity 301, one or more terminals of plug 302 coupled to cable 413, such as terminal 424 makes contact with a corresponding lead, such as lead 315 of jack 234. Electrical contact between leads 312-318 of jack 234 and corresponding terminals of plug 302 drives circuit 330 into a state different from the state of circuit 330 prior to insertion of plug 302 into jack 234. The change of state of circuit 330 can result in circuit 330 driving LED 342 into for example an on-state or an off-state. In the on-state, LED 342 transmits light 490 into cavity 301. As described above, light 490 from LED 342 passes through transparent portion (also referred to as "plug portion") 492 of plug 302 and a light portion 495 of light 490 emerges into a front region 390. The integration of visual indication with a plug 302 or a jack 234 or both as described above has a pleasing and aesthetic effect on a user, in addition to the space having advantages described above.

Numerous modifications and adaptations of the embodiments described above are possible. For example, although jack 234 has been described as having a side opening 341 in one embodiment, in another embodiment there is no side opening and jack portion 335 of housing 300 around the location of LED 342 is transparent, and as illustrated in FIG. 3A, a clearance distance "c" is provided between bottom surface 305 of jack 234 and top surface 241 of printed circuit board 210 to accommodate LED 342.

In another embodiment illustrated in FIG. 4A, jack 234 and PCB 210 are mounted flush against each other so that a portion of LED 342 is surrounded by the edge of housing 300 that defines side opening 341. The embodiment of FIG. 4A has the advantage that the majority of light 490 from LED 342 emerges into front region 390.

Figure 4B:
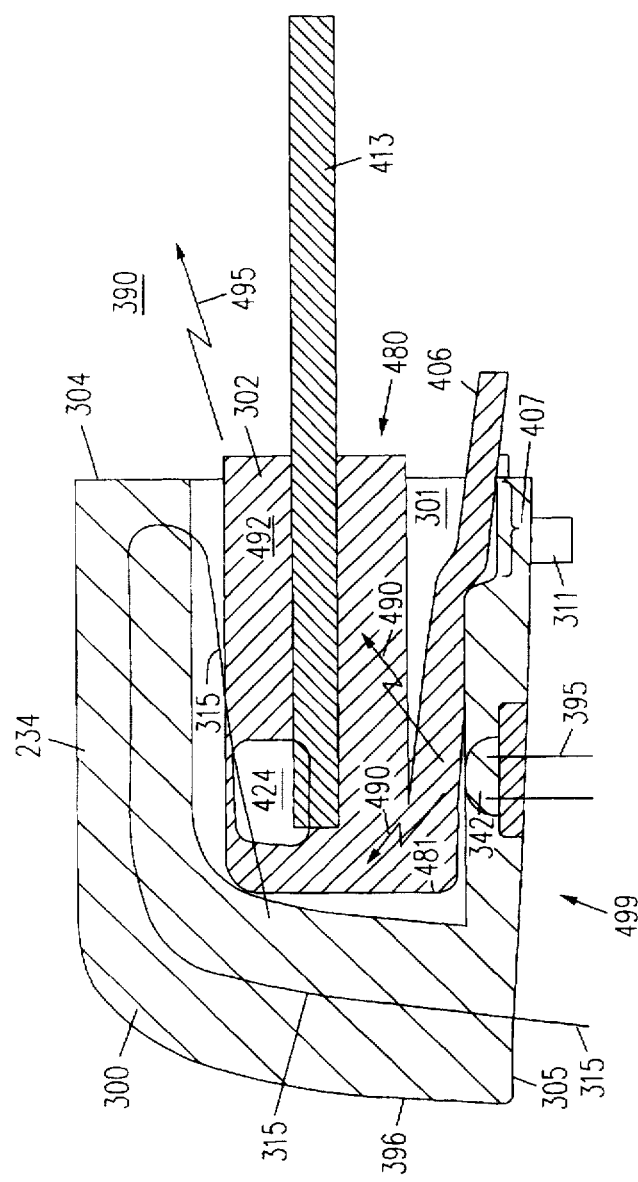
FIG. 4B illustrates a cross-sectional view of a conventional plug inserted in a novel light emitting jack of this invention.

In yet another embodiment illustrated in FIG. 4B, jack 234 and LED 342 are built together as a single component called "light emitting jack 499" that is formed by attaching LED 342 to a mold and injecting plastic into the mold to form jack 234 around LED 342. The embodiment of FIG. 4B eliminates a step in assembly of a printed circuit board, resulting in reduced labor cost as compared to a conventional jack assembly, because mounting light emitting jack 499 results in mounting both jack 234 and LED 342. Although not essential to practicing this invention, jack 234 and LED 342 can both be formed of the same or similar plastic to enhance adhesion between each other. Fusion of the plastic of jack 234 and LED 342 results in the elimination of boundaries between these two parts in one embodiment of a light emitting jack. Although LED 342 has been described above as being an integral part of bottom surface 305 of light emitting jack 499, in alternative embodiments LED 342 is an integral part of other portions of housing 300, such as rear surface 396, a side surface (not labeled) of top surface (not labeled).

Figure 5:
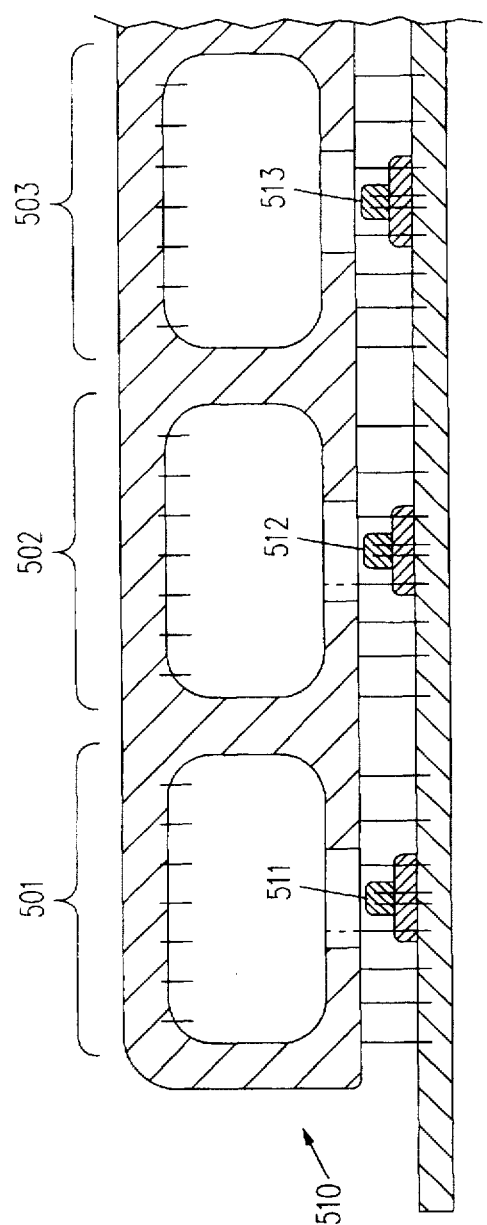
FIG. 5 illustrates a cross-sectional view of a jack assembly mounted over a number of LEDs in another embodiment of this invention.

Also, in another embodiment, plug portion 492 defines an opening to permit passage of light rather than being transparent in the embodiment described above. Also, although the above description refers to a plug having a clip, other types of plugs can also be used in other embodiments. Although the above description refers to an individual jack, a number of jacks 501–503 (FIG. 5) of a jack assembly 580 are mounted over a corresponding number of LEDs 511–513 in one embodiment of this invention. In another embodiment, a jack assembly comprises a number of light emitting jacks that are molded together as a single component.

Also in other embodiments of this invention, a light emitter that can emit light of various colors, such as red, orange and green can be used instead of LED 342 described above for one embodiment.

Various modifications and adaptations of the above described embodiments are encompassed by the attached claims.

I claim:

1. An apparatus comprising:
   a plug having at least a portion that allows passage of light through said plug;
   a jack having a housing, said housing comprising a first surface and a second surface, wherein said first surface defines a first opening for insertion of said plug, and said second surface defines a second opening, at least a portion of said light emitter is surrounded by said second opening; and
   a light emitter mounted adjacent said second opening of said housing;
   wherein said light emitter emits light when said light emitter is operated in a first state and at least a portion of light emitted by said light emitter passes through said second opening, said portion of said plug, and said first opening to a region outside said jack to provide a visible indication of said first state after insertion of said plug into said jack.

2. The apparatus of claim 1 wherein said portion of said plug is transparent thereby to allow passage of said light.

3. The apparatus of claim 1 wherein said portion of said plug defines an opening thereby to allow passage of light.

4. The apparatus of claim 1 wherein substantially all the light passing through the front opening of the jack is emitted by the light emitter.

5. The apparatus of claim 1 wherein said light emitter comprises a light emitting diode and said light portion is the majority of light from said light emitting diode.

6. The apparatus of claim 1 wherein said light emitter and said jack are formed as a single molded component.

7. The apparatus of claim 1 further comprising:
a printed circuit board comprising a circuit wherein said circuit is coupled to said jack and further wherein said circuit is coupled to said light emitter;
wherein said circuit changes the state of said light emitter after at least a terminal of said plug is coupled to said circuit.

8. The apparatus of claim 7 wherein each of said states of said light emitter is selected from the group consisting of an on-state and an off-state.

9. The apparatus of claim 7 wherein, in a first state said light emitter emits light of a first color, in a second state said light emitter emits light of a second color.

10. The apparatus of claim 7 wherein said circuit drives said light emitter into an on-state in response to coupling a terminal of said plug to said circuit.

11. The apparatus of claim 7:
wherein said second surface is approximately transverse to said first surface;
further wherein said light emitter is mounted on a top surface of said printed circuit board, said top surface being approximately parallel to said second surface.

12. The apparatus of claim 11 wherein said jack is mounted on said top surface.

13. The apparatus of claim 7 wherein said housing of said jack is opaque.

14. An apparatus comprising:
a plurality of plugs, at least a portion of a first plug allowing passage of light through said first plug;
a plurality of jacks and a plurality of light emitters, at least a first jack being made of an opaque material, each of said jacks having a front opening for insertion of a plug, at least a portion of light emitted by a first light emitter passing through said front opening of said first jack, the opaque material of said first jack preventing light of said first jack from corrupting the light of a neighboring jack; and
a panel wall supporting said plurality of jacks and said plurality of light emitters, said panel wall defining a plurality of wall openings opposite said front openings such that the majority of light from a front opening passes through a wall opening opposite said front opening.

15. The apparatus of claim 14 wherein after a cable is coupled to a circuit by said jack said circuit drives said light emitter into an on-state.

16. The apparatus of claim 14 further comprising:
a printed circuit board comprising a circuit, each jack of said plurality of jacks being supported by said printed circuit board, each light emitter of said plurality of light emitters being supported by said printed circuit board, wherein said circuit is coupled to each jack, and further wherein said circuit drives each light emitter;
wherein said circuit changes the state of a light emitter after said circuit senses insertion of a plug into a jack located adjacent said light emitter.

17. The apparatus of claim 14 wherein each of said jacks is formed as a portion of a jack assembly.

18. The apparatus of claim 14 wherein said portion of said plug is transparent thereby to allow passage of said light.

19. The apparatus of claim 14 wherein said portion of said plug defines an opening thereby to allow passage of light.

20. The apparatus of claim 14 wherein substantially all the light passing through the front opening of the jack is emitted by the light emitter.

21. A method for visually indicating the state of an apparatus, said method comprising the steps of:
mounting on a printed circuit board a light emitter capable of having one of a plurality of states, said light emitter emitting light when said light emitter is operated in a first state;
mounting on said printed circuit board adjacent to said light emitter a jack having a first opening, a cavity and a second opening; and
inserting a plug into said cavity through said front opening, wherein said light emitter emits light on insertion of said plug and a portion of said light passes through said second opening, said plug and said first opening to a region in front of said jack.

22. The method of claim 21 further comprising the step of driving said light emitter into an on-state in response to insertion of said plug into said jack.

23. The method of claim 21 wherein during said step of mounting said jack, said jack is mounted over said light emitter in an area of said printed circuit board surrounding said light emitter.

24. An apparatus comprising:
a jack having a housing, said housing comprising means for receipt of a plug, said housing further comprising means for transmitting light and at least an opaque portion; and
light emitting means for emitting light when said light emitting means is operated in a first state, said light emitting means being mounted adjacent said means for transmitting light of said jack;
wherein, when said light emitting means emits light, at least a portion of said light passes through said means for transmitting light to a region outside said housing to provide a visible indication of the state of said apparatus, the opaque portion of said housing preventing said emitted light from corrupting the light of a neighboring jack.

25. The apparatus of claim 24 wherein said means for transmitting light defines an opening and said portion of light passes through said opening prior to said passage to said region.

26. The apparatus of claim 24 wherein said means for transmitting light is a transparent portion of said housing and said portion of light passes through said transparent portion prior to said passage to said region.

27. The apparatus of claim 24 wherein said light emitting means comprises a light emitting diode and said portion is the majority of light from said light emitting diode.

28. The apparatus of claim 24 further comprising:
a plug having an anterior end and a posterior end, said anterior end being connected to a cable, said posterior end being suitable for insertion into said jack;
wherein said portion of said light passes through a transparent part of said plug and emerges from said anterior end during passage to said region.

29. The apparatus of claim 28 wherein each of said states is selected from the group consisting of an on-state and an off-state.

30. The apparatus of claim 28 wherein, in a first state said light emitting means emits red light, in a second state said light emitting means emits yellow light and in a third state said light emitting emits green light.

31. The apparatus of claim 28 wherein said circuit drives said light emitting means into an on state in response to coupling said cable to said circuit.

32. The apparatus of claim 24 further comprising:

a printed circuit board comprising a circuit wherein said circuit is coupled to said jack and further wherein said circuit is coupled to said light emitting means;

wherein said circuit changes the state of said light emitting means after electrical coupling between said circuit and a terminal of a plug inserted in said lack.

33. An apparatus comprising:

a printed circuit board comprising a circuit;

a jack mounted on said printed circuit board and coupled to said circuit, said jack having a first opening for inserting a plug and a second opening; and a light emitter mounted on said printed circuit board between said jack and said printed circuit board and adjacent said second opening, said light emitter being driven by said circuit;

wherein when said plug is inserted into said jack, said circuit drives said light emitter to emit light and at least a portion of said light passes through said second opening and said first opening to a region in front of said jack to provide a visual indication.

34. The apparatus of claim 33 further comprising a plug having a transparent portion and located in said jack, said light passing through said transparent portion during passage from said side opening to said first opening.

35. An apparatus comprising:

a plurality of apparatuses of claim 33 mounted on a jack panel, said jack panel defining a plurality of third openings, each third opening of said plurality of third openings being adjacent to a first opening, wherein each jack of said plurality of jacks is opaque.

36. The apparatus of claim 33 wherein said light emitter and said jack are formed as parts of a single component molded from an opaque plastic.

37. The apparatus of claim 33 wherein substantially all the light passing through the front opening of the jack is emitted by the light emitter.

38. An apparatus comprising:

a jack having a cavity, a front opening, and a side opening located transverse to said front opening; and a light emitter located adjacent to said side opening thereby to allow at least a portion of light emitted by the light emitter after insertion of a plug into said cavity to pass through the side opening, the plug, and the front opening to a region outside the jack.

39. The apparatus of claim 38, wherein the side opening is formed in a surface of the jack, the surface being located adjacent to a printed circuit board included in the apparatus.

40. The apparatus of claim 39 wherein the light emitter is mounted on the printed circuit board.

41. The apparatus of claim 38 wherein the light emitter and the jack are built together as a single component, with the light emitter being built into a wall of the jack.

42. The apparatus of claim 38 wherein substantially all the light passing through the front opening of the jack is emitted by the light emitter.

* * * * *